United States Patent
Chai et al.

(10) Patent No.: US 12,554,054 B2
(45) Date of Patent: Feb. 17, 2026

(54) ELECTRONIC DEVICE AND MANUFACTURING METHOD OF THE SAME

(71) Applicant: Samsung Display Co., LTD., Yongin-si (KR)

(72) Inventors: Youngki Chai, Hwaseong-si (KR); Seonggeun Won, Hwaseong-si (KR); Youngji Kim, Hwaseong-si (KR); Young Seo Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 234 days.

(21) Appl. No.: 17/199,442

(22) Filed: Mar. 12, 2021

(65) Prior Publication Data
US 2021/0389514 A1 Dec. 16, 2021

(30) Foreign Application Priority Data
Jun. 11, 2020 (KR) .......................... 10-2020-0071166

(51) Int. Cl.
*G02B 5/30* (2006.01)
*H10K 59/122* (2023.01)
*H10K 59/50* (2023.01)
*H10K 59/80* (2023.01)

(52) U.S. Cl.
CPC ......... *G02B 5/3033* (2013.01); *G02B 5/3025* (2013.01); *H10K 59/122* (2023.02); *H10K 59/50* (2023.02); *H10K 59/8791* (2023.02)

(58) Field of Classification Search
CPC .. H10K 59/122; G02B 5/3025; G02B 5/3033; G02B 5/3041; G02B 5/305
See application file for complete search history.

(56) References Cited

U.S. PATENT DOCUMENTS

| | | |
|---|---|---|
| 8,467,177 B2 | 6/2013 | Mathew et al. |
| 9,618,669 B2 | 4/2017 | Chen |
| 10,009,525 B2 | 6/2018 | Mathew et al. |
| 10,081,141 B2 | 9/2018 | Lee et al. |
| 10,101,511 B2 | 10/2018 | Goto et al. |
| 10,288,788 B2 | 5/2019 | Chen |
| 10,491,726 B2 | 11/2019 | Lee et al. |

(Continued)

FOREIGN PATENT DOCUMENTS

| | | | |
|---|---|---|---|
| CN | 107710039 A | 2/2018 | |
| EP | 3422091 A1 * | 1/2019 | ............... G01J 1/02 |

(Continued)

*Primary Examiner* — Chad M Dicke
*Assistant Examiner* — Valerie N Newton
(74) *Attorney, Agent, or Firm* — CANTOR COLBURN LLP

(57) ABSTRACT

An electronic device includes an electronic module, a display panel including a first area overlapping the electronic module and a second area surrounding at least a portion of the first area, and a polarizing plate which is disposed on the display panel and includes a polarizer layer in an uppermost layer, wherein the polarizing plate includes a transmissive area which overlaps the first area and in which at least one recess is defined, and a polarizing area overlapping the second area, so that an electronic device may be provided which has improved light transmittance in a portion overlapping an electronic module.

8 Claims, 14 Drawing Sheets

(56) References Cited

U.S. PATENT DOCUMENTS

| | | | |
|---|---|---|---|
| 2014/0118826 A1 | 5/2014 | Jiao et al. | |
| 2014/0126053 A1* | 5/2014 | Won | G02F 1/133533 |
| | | | 252/585 |
| 2015/0002010 A1* | 1/2015 | Lee | G02B 5/3083 |
| | | | 359/489.07 |
| 2015/0070614 A1 | 3/2015 | Kim et al. | |
| 2015/0131035 A1* | 5/2015 | Chen | G02F 1/133533 |
| | | | 427/163.1 |
| 2016/0202403 A1 | 7/2016 | Mathew et al. | |
| 2017/0153473 A1* | 6/2017 | Lee | G02F 1/133308 |
| 2017/0306237 A1* | 10/2017 | Morimoto | C09K 19/2007 |
| 2018/0026152 A1 | 1/2018 | Benson et al. | |
| 2018/0173050 A1* | 6/2018 | Yaegashi | G02B 5/30 |
| 2018/0188430 A1 | 7/2018 | Nagano et al. | |
| 2018/0196180 A1* | 7/2018 | Choi | G02B 1/111 |
| 2018/0315357 A1 | 11/2018 | Nam et al. | |
| 2019/0243041 A1* | 8/2019 | Takarada | C09J 133/066 |
| 2019/0331960 A1* | 10/2019 | Li | G02F 1/133615 |
| 2020/0212140 A1* | 7/2020 | Huh | H10K 59/124 |
| 2021/0098746 A1* | 4/2021 | Guo | H10K 50/86 |
| 2021/0111357 A1* | 4/2021 | Kawaguchi | G02F 1/1335 |
| 2021/0223607 A1* | 7/2021 | Liu | G02B 1/11 |
| 2022/0158142 A1* | 5/2022 | Zhang | H10K 50/868 |
| 2023/0096985 A1* | 3/2023 | Chen | H10K 77/111 |
| | | | 257/40 |

FOREIGN PATENT DOCUMENTS

| | | |
|---|---|---|
| JP | 2009163085 A | 7/2009 |
| JP | 2014164085 A | 9/2014 |
| KR | 10-1202577 | 11/2012 |
| KR | 10-1286523 | 7/2013 |
| KR | 10-1495759 | 2/2015 |
| KR | 10-2017-0055014 | 5/2017 |
| KR | 10-1737175 | 5/2017 |
| KR | 20180011239 A | 1/2018 |
| KR | 10-1828712 | 2/2018 |
| KR | 20190083176 A | 7/2019 |
| KR | 10-2075830 | 2/2020 |

* cited by examiner

ELECTRONIC DEVICE AND
MANUFACTURING METHOD OF THE SAME

CROSS REFERENCE TO RELATED
APPLICATION

This application claims priority from and the benefit of Korean Patent Application No. 10-2020-0071166, filed on Jun. 11, 2020, which is hereby incorporated by reference for all purposes as if fully set forth herein.

BACKGROUND

Field

Embodiments of the invention relate generally to an electronic device and a manufacturing method of the electronic device and, more specifically, to an electronic device including a polarizing plate having a non-polarizing area and a manufacturing method of the electronic device.

Discussion of the Background

Recently, various portable electronic devices are proliferating, and functions thereof are gradually being diversified. Users prefer an electronic device having a wider display area and a narrower bezel area. To this end, the development of electronic devices of various configurations is underway, and an example is an electronic device in which a camera and a sensor overlap a display area.

On the other hand, there is a need to increase the transmittance of a portion of a polarizing plate applied to an electronic device in order to allow a camera to overlap a display area, and to this end, studies of various manufacturing methods of an electronic device are being carried out.

The above information disclosed in this Background section is only for understanding of the background of the inventive concepts, and, therefore, it may contain information that does not constitute prior art.

SUMMARY

Devices constructed according to implementations/embodiments of the invention are capable of The present disclosure provides an electronic device having improved light transmittance in a display area by including a non-polarizing area in an area where a polarizing plate overlaps an electronic module.

In addition, the present disclosure provides a manufacturing method of an electronic device including an irreversible non-polarizing area by including irradiating with laser light and providing a neutral solution.

Additional features of the inventive concepts will be set forth in the description which follows, and in part will be apparent from the description, or may be learned by practice of the inventive concepts.

One or more embodiments of the inventive concepts provide an electronic device including: an electronic module, a display panel including a first area overlapping the electronic module and a second area surrounding at least a portion of the first area; and a polarizing plate which is disposed on the display panel and includes a polarizer layer in an uppermost layer, wherein the polarizing plate includes: a transmissive area which overlaps the first area and in which at least one recess is defined; and a polarizing area overlapping the second area.

In an embodiment, the at least one recess may not include the polarizer layer.

In an embodiment, the polarizer layer may include a stretched film and a plurality of light absorbing agents adsorbed on the film, and the at least one recess may include a portion of the film from which at least some of the light absorbing agents have been removed.

In an embodiment, the thickness of the polarizer layer may be smaller in the recess than in the polarizing area.

In an embodiment, the display panel may include a pixel layer including a plurality of light emitting areas and a plurality of non-light emitting areas, and the at least one recess may overlap at least some of the plurality of non-light emitting areas.

In an embodiment, the at least one recess may be defined in plurality in the transmissive area, the transmissive area may include a protrusion disposed between the plurality of recesses, and the thickness of the polarizing plate may be smaller at each of the recesses than at the protrusion.

In an embodiment, a light transmittance at the recesses may be greater than a light transmittance at the protrusion.

In an embodiment, the electronic device may further include a window disposed on the polarizing plate and an adhesive layer disposed between the polarizing plate and the window.

In an embodiment, the polarizing plate and the adhesive layer may be spaced apart from each other in a thickness direction in the transmissive area.

In an embodiment, the adhesive layer may fill the at least one recess.

In one or more embodiments of the inventive concepts, a manufacturing method of an electronic device includes: providing a display panel; providing, on the display panel, a preliminary polarizing plate including a polarizer layer in an uppermost layer; irradiating the preliminary polarizing plate with laser light; and providing a neutral solution to the preliminary polarizing plate irradiated with the laser light to form a polarizing plate including a transmissive area having at least one recess and a polarizing area surrounding the transmissive area.

In an embodiment, the laser light may be light of a pulse laser having a pulse width of about a few picoseconds or less.

In an embodiment, the polarizer layer may include a stretched film and light absorbing agents adsorbed on the film, and the irradiating with the laser light may include decomposing a first polymer having a first molecular weight included in the film into a second polymer having a second molecular weight smaller than the first molecular weight.

In an embodiment, the providing of the neutral solution may include removing a portion of the film including the second polymer to form the at least one recess.

In an embodiment, the laser light may be light of a continuous laser or light of a pulse laser having a pulse width greater than about a few picoseconds and not greater than about a few nanoseconds.

In an embodiment, the polarizer layer may include a stretched film and light absorbing agents adsorbed on the film, and the irradiating with the laser light may include dissociating the bond of the film and the light absorbing agents.

In an embodiment, the providing of the neutral solution may include detaching the light absorbing agents from the film to form the at least one recess, and the thickness of the polarizer layer may be smaller at the at least one recess than in the polarizing area.

In an embodiment, the laser light may be selected from light having wavelengths in a range of about 340 nm to about 810 nm.

In an embodiment, the temperature of the neutral solution may be about 5° C. to about 90° C.

In an embodiment, the neutral solution may be deionized water.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
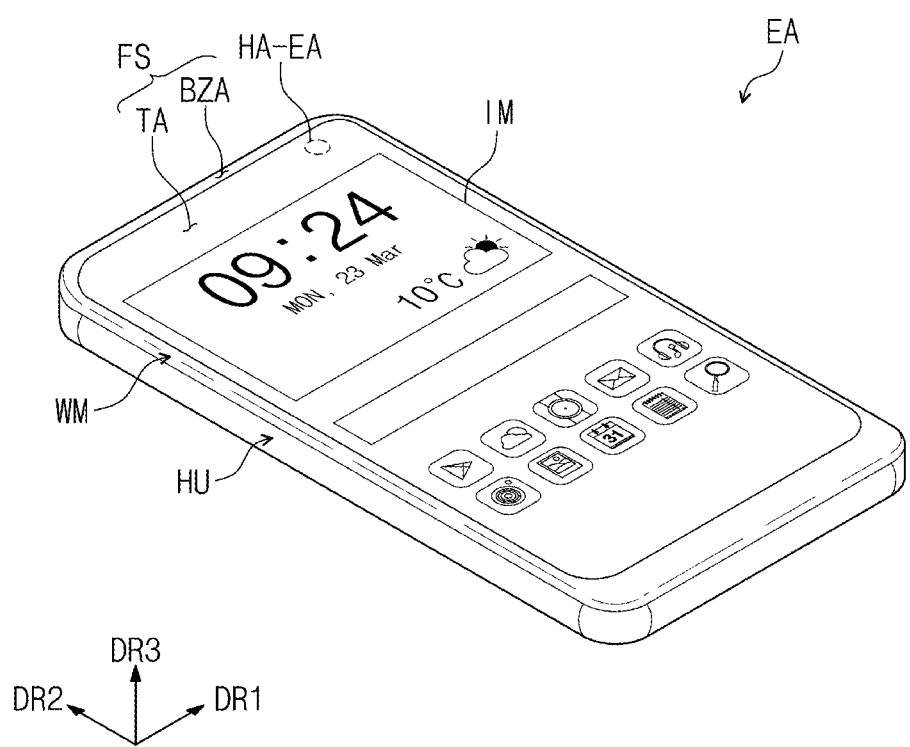
FIG. 1 is a perspective view of an electronic device according to an embodiment of the inventive concepts.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As an embodiment of the inventive concepts can have various changes and modifications made thereto and take many forms, specific embodiments of the inventive concepts are illustrated in the accompanying drawings and are hereinafter described in detail. However, it should be understood that this is not intended to limit the inventive concepts to specific forms of disclosure but is intended to include all changes and modifications, equivalents, and substitutes within the scope of the inventive concepts.

Hereinafter, an electronic device and a manufacturing method of an electronic device according to an embodiment of the inventive concepts will be described with reference to the accompanying drawings.

Figure 2:
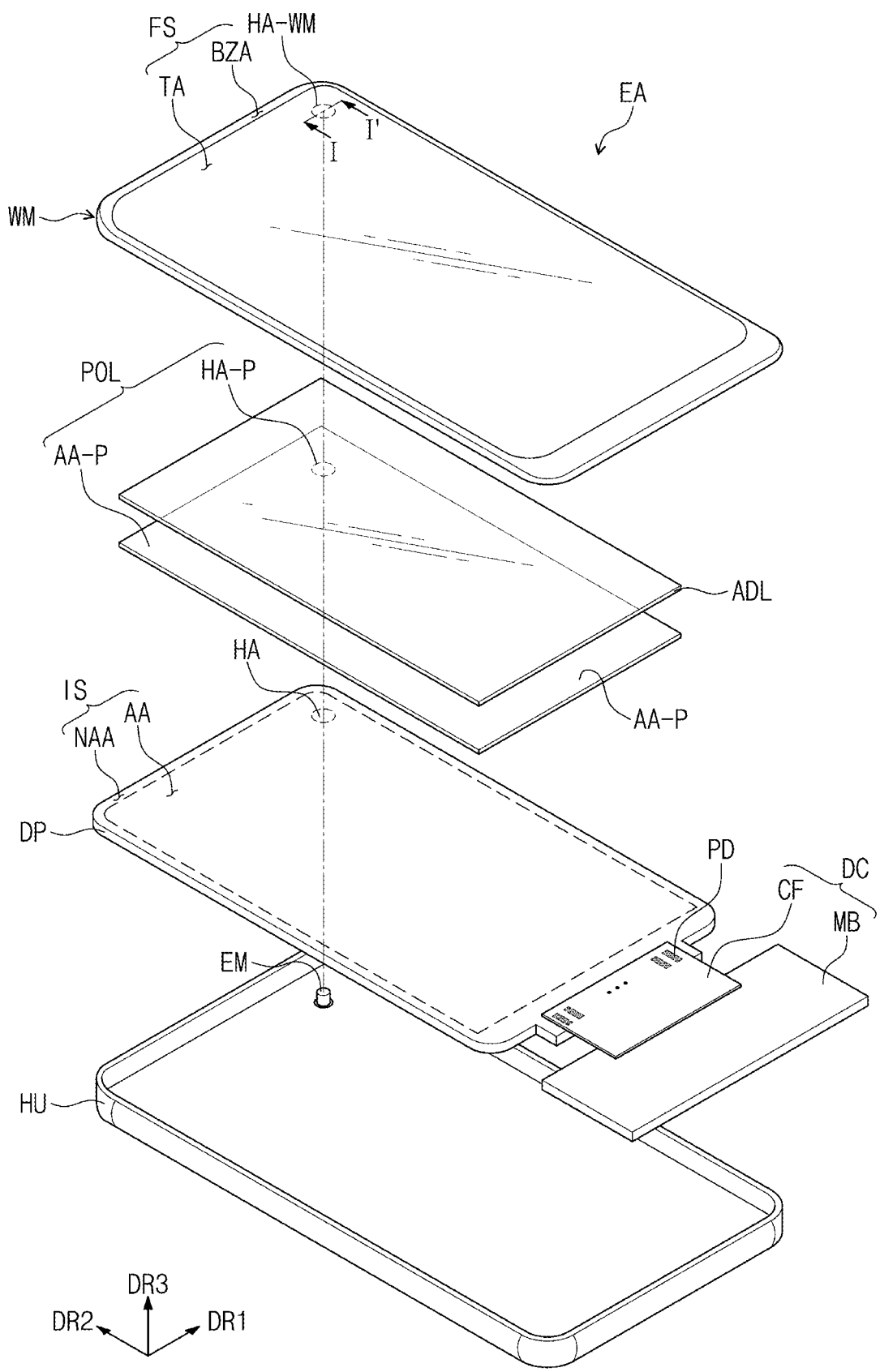
FIG. 2 is an exploded perspective view of an electronic device according to an embodiment of the inventive concepts.

FIG. 1 is a perspective view of an electronic device according to an embodiment of the inventive concepts. FIG. 2 is an exploded perspective view of the electronic device illustrated in FIG. 1. Hereinafter, an electronic device EA according to an embodiment of the inventive concepts will be described with reference to FIGS. 1 and 2.

Referring to FIG. 1, the electronic device EA may be a device that is activated according to an electrical signal. For example, the electronic device EA may include a computer, a laptop computer, a tablet, and a television. The electronic device EA may also be employed as another electronic device as long as the electronic device EA does not depart from the inventive concepts. In this specification, the electronic device EA is exemplarily illustrated as a smartphone.

The electronic device EA may be flexible. This may mean having bending properties and may include an electronic device from a fully folded structure to a structure in which the electronic device may be bent up to a few nanometers.

For example, the electronic device EA may be a curved electronic device or a foldable electronic device. Also, the electronic device EA may be rigid.

The electronic device EA of an embodiment includes a housing HU, a display panel DP, a polarizing plate POL, an adhesive layer ADL, and a window WM.

The window WM includes a front surface FS exposed to the outside. A front surface FS of the electronic device EA may be substantially defined by the front surface FS of the window WM. The electronic device EA may display an image IM on the front surface FS. The front surface FS may be defined as a plane parallel to a plane defined by a first direction axis DR1 and a second direction axis DR2. The front surface FS includes a display area TA and a bezel area BZA adjacent to the display area TA.

The window WM is disposed on the display panel DP to cover a front surface IS of the display panel DP. The window WM may include an optically clear insulating material. For example, the window WM may be glass or plastic. The window WM may have a multilayer structure or a single layer structure.

In this embodiment, a front surface (or a top surface) and a rear surface (or a bottom surface) of each of members are defined in relation to a direction in which the image IM is displayed. The front surface and the rear surface are opposed to each other in a third direction axis DR3.

Meanwhile, directions indicated by the first to third direction axes DR1 to DR3 are relative and may be converted into different directions. Hereinafter, first to third directions are directions respectively indicated by the first to third direction axes DR1 to DR3 and are denoted by the same reference numerals.

The image IM may be displayed in the display area TA of the electronic device EA. The image IM may include at least one of a still image or a moving image. In an embodiment in FIG. 1, a plurality of icons, a clock, and the like are illustrated as the image IM.

A quadrangular shape parallel to the first direction axis DR1 and the second direction axis DR2 is illustrated as an example of the display area TA. However, this is exemplarily illustrated, and the display area TA may have various shapes and is not limited to any particular embodiment.

The bezel area BZA is adjacent to the display area TA. As illustrated in FIG. 1, the bezel area BZA may surround the display area TA. However, this is one embodiment, and the bezel area BZA may be disposed adjacent to only one side of the display area TA or may be omitted.

Referring to FIG. 2, the electronic device EA according to an embodiment may include a first area HA-EA (referred to as a hole area HA-EA or the first area HA-EA) in which a hole is defined. The image IM provided on the electronic device EA may be displayed surrounding at least a portion of an edge of the first area HA-EA. In another embodiment, on the other hand, an image IM provided on an electronic device EA may be displayed in the entirety of a display area TA and a first area HA-EA. In other words, the image IM may also be displayed in the first area HA-EA.

The display panel DP may include a first area HA and a second area AA surrounding at least a portion of the first area HA. The second area AA may be defined as an active area AA, and the first area HA may be defined as a hole area HA. The first area HA of the display panel DP may correspond to the first area HA-EA of the electronic device EA.

The shape of the first area HA may be variously defined. Although the first area HA is illustrated in this embodiment as having a circular shape when viewed in a plane, an embodiment of the inventive concepts is not limited thereto, and the first area HA may be provided in various shapes, when viewed in a plane, such as an elliptical shape, a quadrangular shape, and a shape of a figure having a combination of curved and straight sides.

At least a portion of the first area HA may be surrounded by the active area AA. In this embodiment, the first area HA is illustrated such that the entirety of an edge of the first area HA is surrounded by the active area AA. In an assembled state of the electronic device EA, the first area HA may be defined at a position which overlaps the first area HA-EA and is spaced apart from the bezel area BZA.

A display area TA of the window WM may be an optically clear area. The display area TA of the window WM may have a shape corresponding to that of the active area AA. For example, the display area TA overlaps the entirety of or at least a portion of the active area AA. The image IM displayed in the active area AA of the display panel DP may be viewed from the outside through the display area TA.

A peripheral area NAA is adjacent to the active area AA. The peripheral area NAA may surround the active area AA. A driving circuit, driving wirings, or the like for driving the active area AA may be disposed in the peripheral area NAA.

The peripheral area NAA may be an area covered by the bezel area BZA. The bezel area BZA may cover the peripheral area NAA to block the peripheral area NAA from being viewed from the outside. Meanwhile, this is exemplarily illustrated, and the bezel area BZA may be omitted.

The polarizing plate POL is disposed between the window WM and the display panel DP. The polarizing plate POL may lower a degree of reflection of external light incident from the outside of the window WM. This may improve visibility under external light.

The polarizing plate POL according to an embodiment may include a transmissive area HA-P overlapping the first area HA of the display panel DP and a polarizing area AA-P overlapping the second area AA of the display panel DP. At least a portion of the transmissive area HA-P may be surrounded by the polarizing area AA-P. The transmissive area HA-P may include at least one non-polarizing portion. The transmissive area HA-P may overlap an electronic module EM and may be an area having a higher light transmittance than the polarizing area AA-P of the polarizing plate POL. In this specification, meanwhile, the at least one non-polarizing portion included in the transmissive area HA-P may correspond to a recess CU-P (see FIG. 3A).

The adhesive layer ADL may be disposed between the polarizing plate POL and the window WM to bond the polarizing plate POL and the window WM. The adhesive layer ADL may include an optically clear adhesive or an optically clear resin.

The electronic module EM may be disposed below the window WM. The electronic module EM may overlap the first area HA of the display panel DP when viewed in a plane. Because the electronic module EM is disposed to overlap the first area HA, the bezel area BZA may be prevented from becoming bigger.

The electronic module EM may overlap the transmissive area HA-P of the polarizing plate POL overlapping the first area HA. The electronic module EM may receive an external input transmitted through the transmissive area HA-P or provide an output through the transmissive area HA-P. The first area HA may be an area in which a camera module or the like for photographing an external subject is disposed, or an area in which an optical sensor for sensing light is disposed. That is, in the electronic device EA of an embodiment, the electronic module EM may be a camera module having a lens disposed to face the front surface FS or a sensor sensing an external stimulus.

The electronic device EA may include a circuit board DC connected to the display panel DP. The circuit board DC may include a flexible board CF and a main board MB. The flexible board CF may include an insulating film and conductive wirings mounted on the insulating film. The conductive wirings are connected to pads PD to electrically connect the circuit board DC and the display panel DP. Various signal lines, the pads PD, an electronic element, or the like for providing an electrical signal to the active area AA may be disposed in the peripheral area NAA.

In an embodiment, the flexible board CF may be assembled in a bent state. Accordingly, the main board MB may be disposed on a rear surface of the display panel DP and thus may be stably accommodated in a space the housing HU provides. On the other hand, the flexible board CF may also be omitted in an embodiment, and in this case, the main board MB may be directly connected to the display panel DP.

The main board MB may include signal lines and electronic elements not illustrated. The electronic elements may be connected to the signal lines to be electrically connected to the display panel DP. The electronic elements generate or process various electrical signals, for example, generate a signal for generating the image IM or a signal for sensing an external input or process a sensed signal. Meanwhile, the main board MB may be provided as a plurality of main boards respectively corresponding to the electrical signals which are generated and processed, and is not limited to any one embodiment.

Hereinafter, necessary elements among the display panel DP, the polarizing plate POL, the adhesive layer ADL, and the window WM are illustrated according to an embodiment as the electronic device EA from which the housing HU is omitted for convenience of description.

FIGS. 3A to 3D are each a cross-sectional view, taken along line I-I' illustrated in FIG. 2, illustrating a portion of an electronic device of an embodiment. FIG. 3E is a plan view illustrating a portion of the polarizing plate illustrated in FIG. 3D. FIG. 3F is a detailed cross-sectional view of an electronic device of an embodiment. Hereinafter, an electronic device of an embodiment will be described in detail with reference to FIGS. 3A to 3F.

Figure 3A:
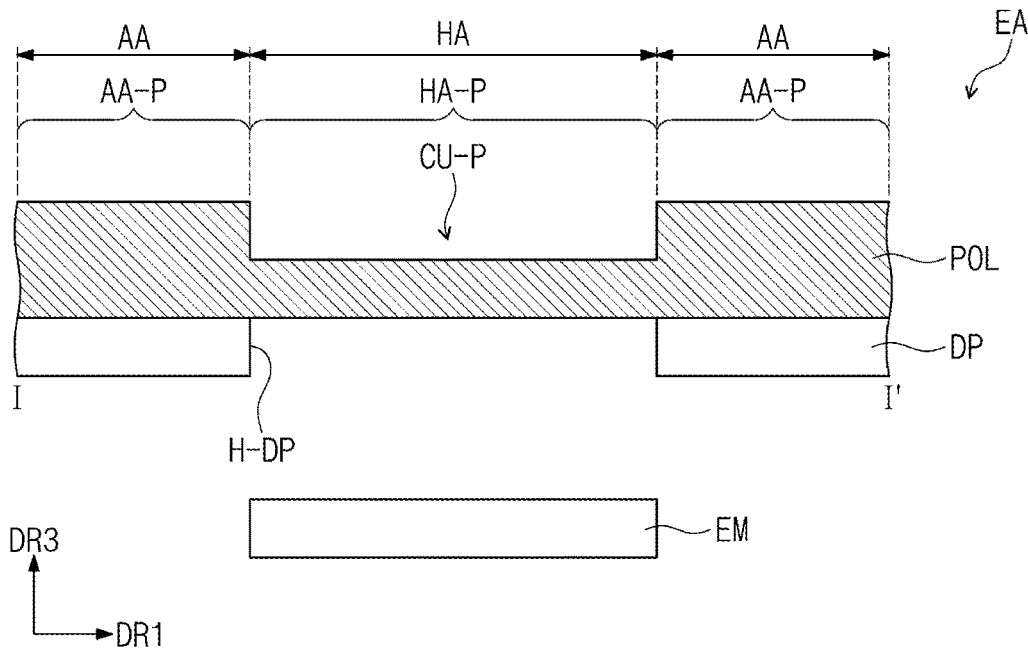
FIG. 3A is a cross-sectional view of a portion of an electronic device according to an embodiment of the inventive concepts.
Figure 3B:
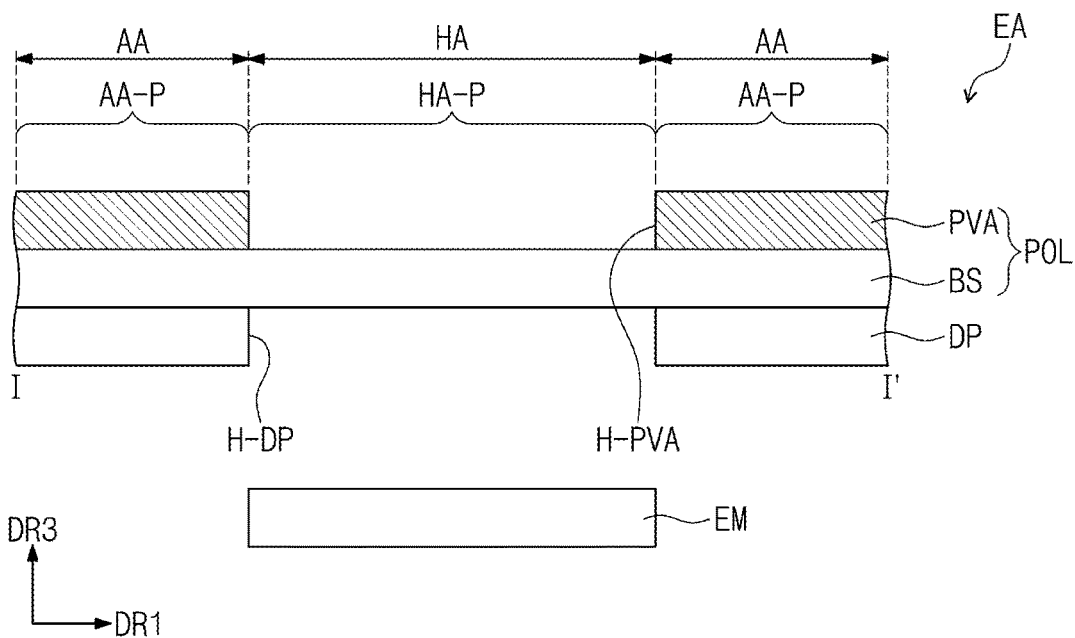
FIG. 3B is a cross-sectional view of a portion of an electronic device according to an embodiment of the inventive concepts.

Referring to FIGS. 3A and 3B, the electronic device EA in each of embodiments may include the electronic module EM, the display panel DP, and the polarizing plate POL disposed on the display panel DP.

The polarizing plate POL illustrated in FIG. 3A may include the transmissive area HA-P overlapping the first area HA and the polarizing area AA-P overlapping the second area AA. The recess CU-P recessed toward the display panel DP may be defined in the transmissive area HA-P. The recess CU-P may be defined by having a height difference in a thickness direction between the transmissive area HA-P and the polarizing area AA-P at a boundary between the transmissive area HA-P and the polarizing area AA-P. That is, the recess CU-P may be formed by removing a portion of an upper portion of the polarizing plate POL.

The polarizing plate POL illustrated in FIG. 3B may include a base member BS and a polarizer layer PVA disposed on the base member BS. The base member BS may include at least one phase delay layer. The polarizer layer PVA may be disposed in an uppermost layer of the polarizing plate POL.

A hole H-PVA may be defined in the polarizer layer PVA in correspondence to the first area HA of the display panel DP. The hole H-PVA defined in the polarizer layer PVA may correspond to the recess CU-P of the polarizing plate POL. That is, the polarizing plate POL according to the embodiment illustrated in FIG. 3B may not include the polarizer layer PVA in the recess CU-P.

The polarizer layer PVA may be an optical layer that polarizes provided light in a direction. The polarizer layer PVA may include a film oriented and stretched in a certain direction. The stretched film may be a polymer film. For example, the stretched polymer film may be a stretched polyvinyl alcohol-based film.

The polarizer layer PVA may be manufactured by adsorbing light absorbing agents on the stretched film. The light absorbing agents may be a dichroic dye or iodine. For example, the polarizer layer PVA may include a polyvinyl alcohol-based film with iodine adsorbed thereon. The polarizer layer PVA including the light absorbing agents may absorb light oscillating in a stretching direction and transmit light oscillating in a perpendicular direction thereof to allow polarized light having a specific oscillation direction to be obtained.

Meanwhile, unlike the illustration of FIG. 3B, a hole H-DP may not be defined in the display panel DP of the electronic device EA according to an embodiment. That is, the hole H-DP may not be defined in a portion of the display panel DP overlapping the electronic module EM, and the recess may be defined in the transmissive area of the polarizing plate POL overlapping the electronic module EM.

Figure 3C:
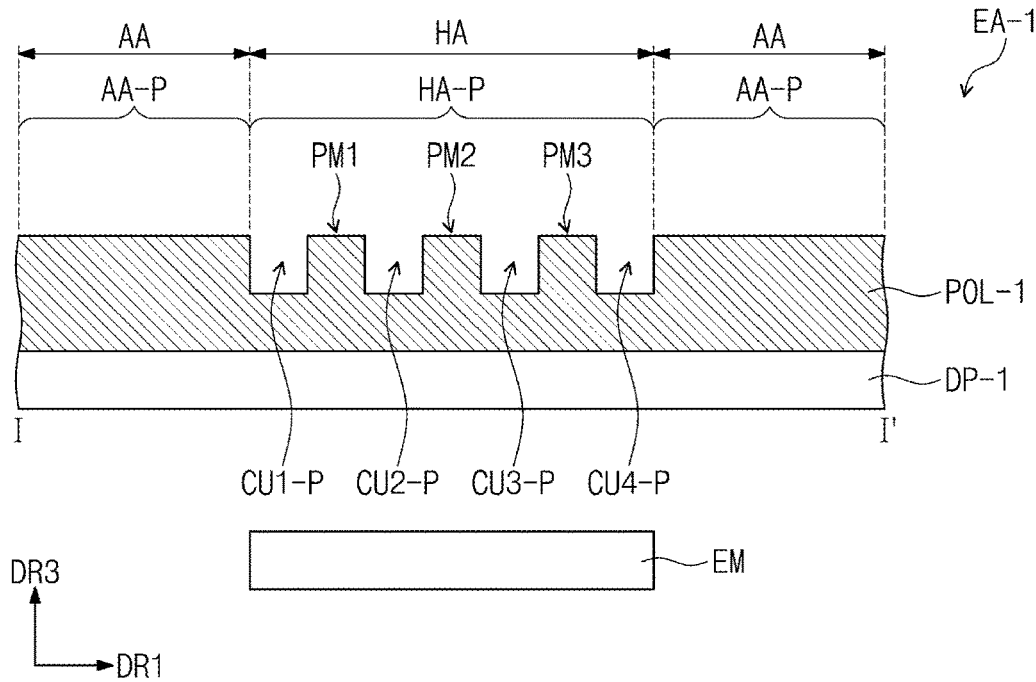
FIG. 3C is a cross-sectional view of a portion of an electronic device according to an embodiment of the inventive concepts.
Figure 3D:
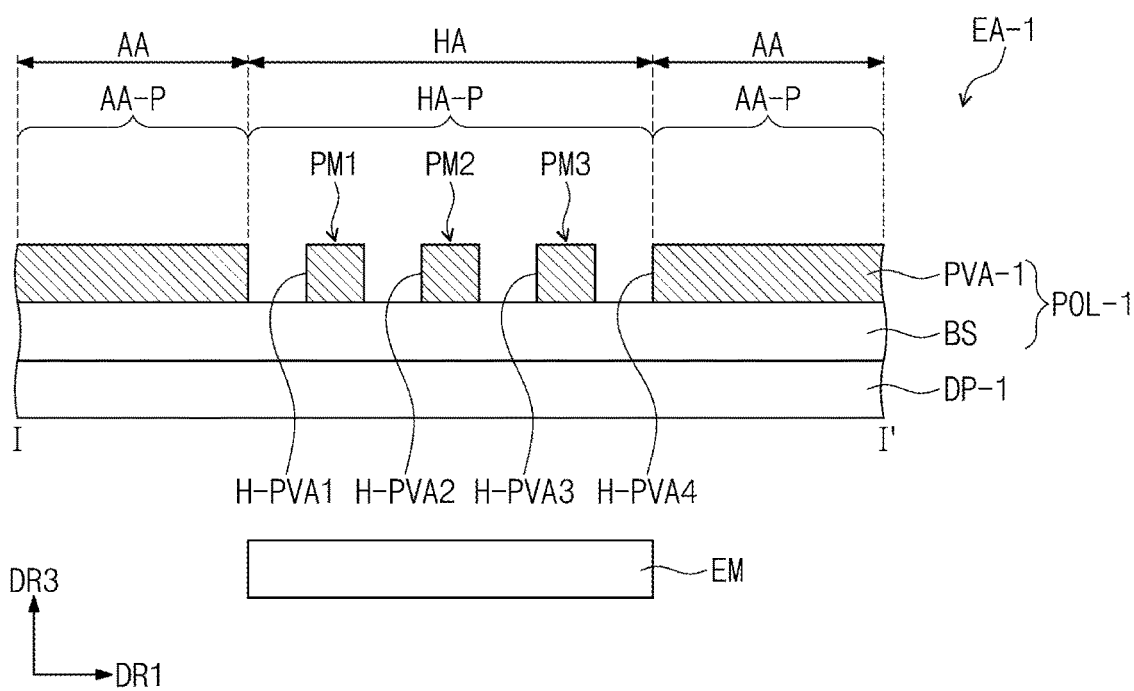
FIG. 3D is a cross-sectional view of a portion of an electronic device according to an embodiment of the inventive concepts.
Figure 3E:
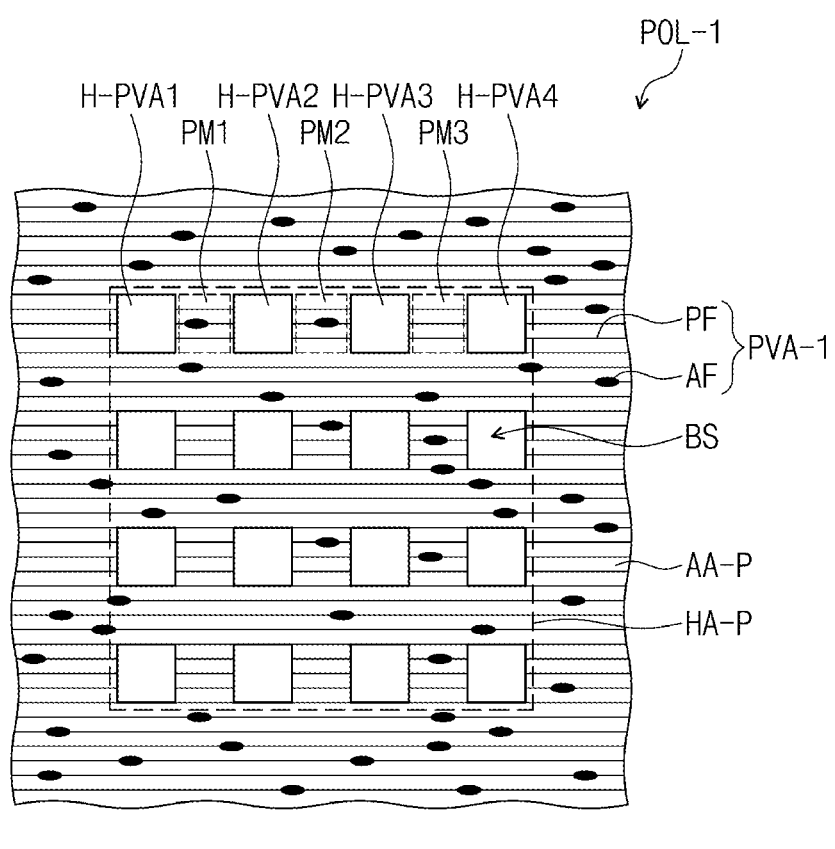
FIG. 3E is a plan view of a portion of a polarizing plate according to an embodiment of the inventive concepts.
Figure 3F:
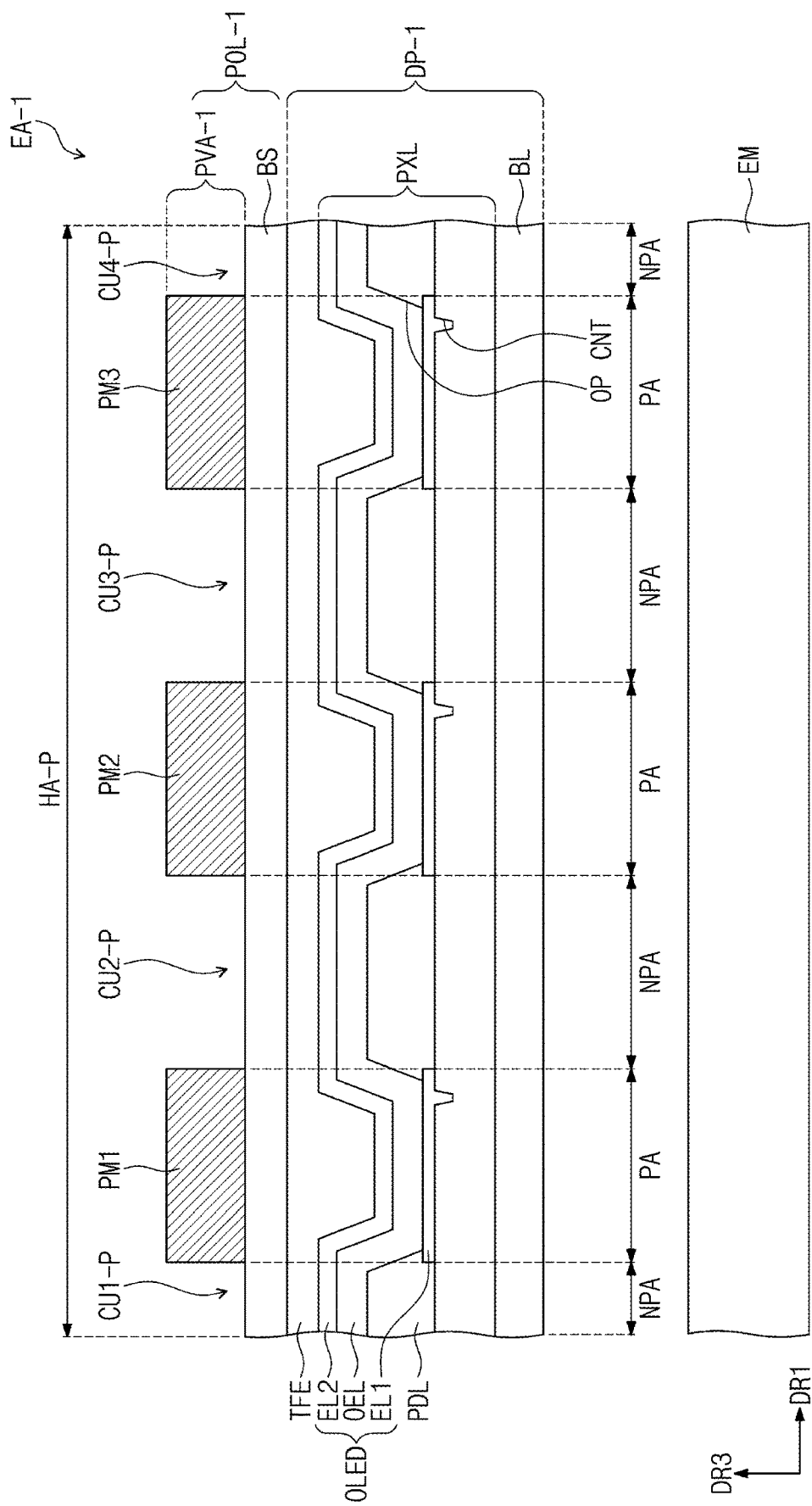
FIG. 3F is a detailed cross-sectional view of a portion of an electronic device according to an embodiment of the inventive concepts.

Referring to FIGS. 3C and 3D, a hole may not be defined in an area of a display panel DP-1 overlapping an electronic module EM in an electronic device EA-1 according to an embodiment. However, this is only exemplary, and the display panel DP-1 according to an embodiment is not limited thereto and may have a hole defined in the area overlapping the electronic module EM.

A polarizing plate POL-1 may include a plurality of recesses CU1-P, CU2-P, CU3-P, and CU4-P defined in a transmissive area HA-P. The transmissive area HA-P may include protrusions PM1, PM2, and PM3 which are disposed between the plurality of recesses CU1-P, CU2-P, CU3-P, and CU4-P and protrude in a thickness direction.

A plurality of holes H-PVA1, H-PVA2, H-PVA3, and H-PVA4 may be defined in a polarizer layer PVA-1. The holes H-PVA1, H-PVA2, H-PVA3, and H-PVA4 defined in the polarizer layer PVA-1 may correspond to the recesses CU1-P, CU2-P, CU3-P, and CU4-P of the polarizing plate POL-1. The thickness of the polarizing plate POL-1 at each of the recesses CU1-P, CU2-P, CU3-P, and CU4-P may be smaller than the thickness of the polarizing plate POL-1 at the protrusions PM1, PM2, and PM3. That is, the recesses CU1-P, CU2-P, CU3-P, and CU4-P may not include the polarizer layer PVA-1, and the protrusions PM1, PM2, and PM3 may include the polarizer layer PVA-1.

FIG. 3E is a plan view illustrating the polarizing plate POL-1 according to an embodiment. When viewed in a plane, the holes H-PVA1, H-PVA2, H-PVA3, and H-PVA4 of the polarizer layer PVA-1 may be surrounded by the protrusions PM1, PM2, and PM3 and a polarizing area AA-P. A base member BS may be exposed to the outside through the holes H-PVA1, H-PVA2, H-PVA3, and H-PVA4 defined in the polarizer layer PVA-1.

FIG. 3F is a cross-sectional view illustrating the electronic device EA-1 according to an embodiment. In an embodiment, the display panel DP-1 includes a base layer BL, a light emitting element OLED, and an encapsulation layer TFE. The light emitting element OLED may include a first electrode EL1 and a second electrode EL2 facing each other, and an organic layer OEL disposed between the first electrode EL1 and the second electrode EL2. Although not illustrated, a hole transport region, a light emitting layer, an electron transport region, and the like may be included in the organic layer OEL.

A pixel layer PXL may include the light emitting element OLED, a transistor (not illustrated) for driving the light emitting element OLED, an insulating layer (not illustrated), and a connection electrode (not illustrated), and the first electrode EL1 of the light emitting element OLED may be connected to the connection electrode (not illustrated) through a contact hole CNT.

The light emitting element OLED may be disposed between portions of a pixel defining film PDL. The pixel defining film PDL may include a light absorbing material. The pixel defining film PDL may overlap non-light emitting areas NPA. A pixel opening OP may be defined in the pixel defining film PDL. The pixel opening OP of the pixel defining film PDL exposes a portion of the first electrode EL1.

The pixel layer PXL of the display panel DP-1 includes a plurality of light emitting areas PA and the plurality of non-light emitting areas NPA. Each of the non-light emitting areas NPA may be an area in which a portion of the light emitting element OLED is omitted or an area in which a portion of the pixel layer PXL is deactivated. In an embodiment, the electronic module EM may overlap a plurality of light emitting areas PA and a plurality of non-light emitting areas NPA.

The recesses CU1-P, CU2-P, CU3-P, and CU4-P of the polarizing plate POL-1 may overlap the non-light emitting areas NPA. Although widths of the recesses CU1-P, CU2-P, CU3-P, and CU4-P are illustrated in FIG. 3F to be respectively the same as widths of the non-light emitting areas NPA, an embodiment of the inventive concepts is not limited thereto. For example, one non-light emitting area NPA may overlap the plurality of recesses CU1-P, CU2-P, CU3-P, and CU4-P and the protrusions PM1, PM2, and PM3 disposed between the recesses CU1-P, CU2-P, CU3-P, and CU4-P.

In an embodiment, the display panel DP-1 may include a plurality of light emitting areas PA overlapping the transmissive area HA-P of the polarizing plate POL-1. The display panel DP-1 according to an embodiment may provide an image IM (see FIG. 1) to a user through the plurality of light emitting areas PA overlapping the electronic module EM.

The electronic device EA-1 according to an embodiment may exhibit improved visibility under external light by including the polarizing plate POL-1 having the protrusions PM1, PM2, and PM3 at portions where the polarizing plate POL-1 overlaps the light emitting areas PA of the display panel DP-1 overlapping the electronic module EM. That is, reflection of light from external light source may be reduced in a first area HA-EA of the electronic device EA-1 by maintaining polarization of the protrusions PM1, PM2, and PM3 of the polarizing plate POL-1 disposed on the light emitting areas PA overlapping the electronic module EM. Accordingly, the image IM (see FIG. 1) may be displayed in a first area HA (see FIG. 1) where the display panel DP-1 and the electronic module EM overlap, so that a user may view the image WI (see FIG. 1) through a wider display area TA (see FIG. 1).

Figure 4A:
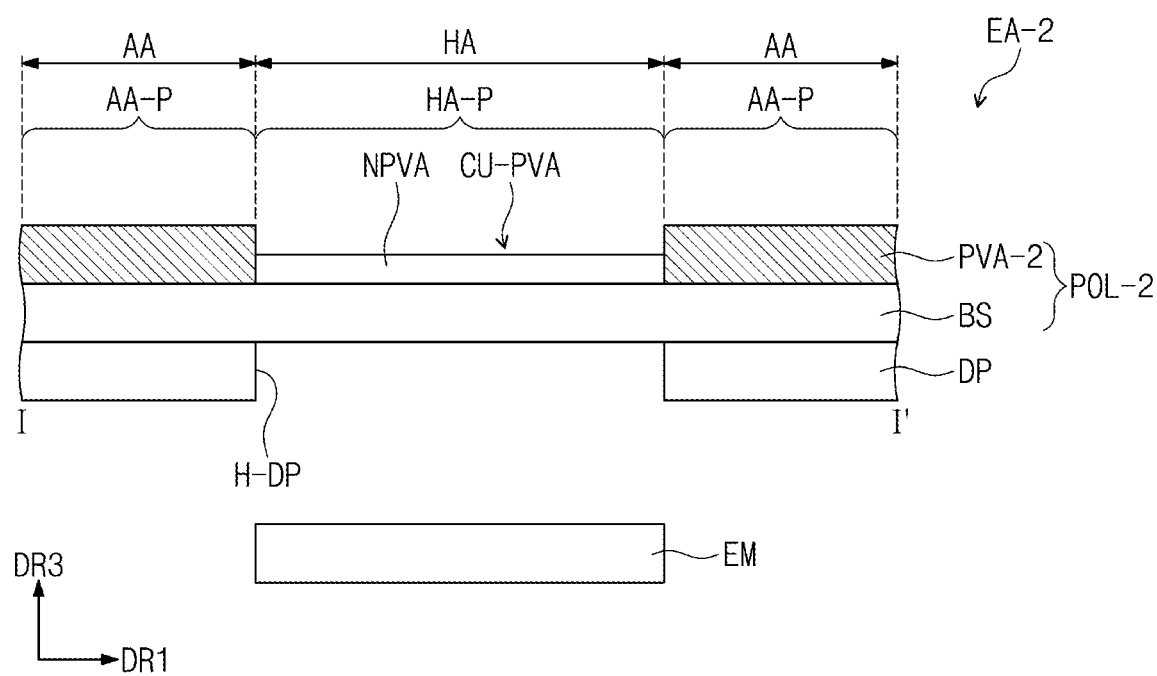
FIG. 4A is a cross-sectional view of a portion of an electronic device according to an embodiment of the inventive concepts.
Figure 4B:
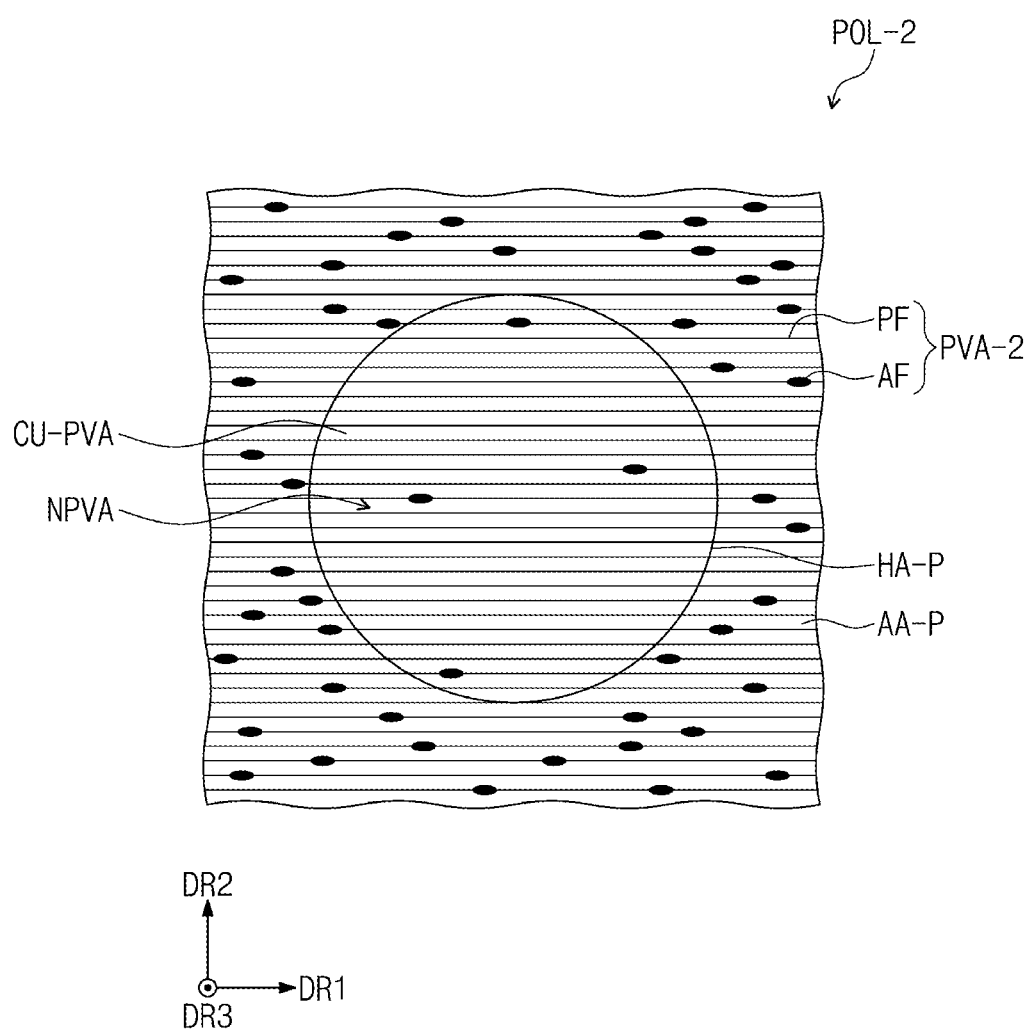
FIG. 4B is a plan view of a portion of a polarizing plate according to an embodiment of the inventive concepts.

FIG. 4A is a cross-sectional view of a portion of an electronic device of an embodiment, and FIG. 4B is a plan view of a portion of a polarizing plate of an embodiment. Hereinafter, an electronic device EA-2 of an embodiment will be described in detail with reference to FIGS. 4A and 4B. Hereinafter, in a description of the electronic device according to an embodiment, a description overlapping with the description given above with reference to FIGS. 1 to 3F will not be given again, and the difference will be mainly described.

Regarding a configuration of a polarizing plate POL-2 in a transmissive area HA-P of the electronic device EA-2, there is a difference between the electronic device EA-2 according to the embodiment illustrated in FIGS. 4A and 4B and the electronic device EA according to the embodiment illustrated in FIGS. 3A and 3B described above. In the electronic device EA-2 of an embodiment, the polarizing plate POL-2 may include, in the transmissive area HA-P, a polarizer layer NPVA from which at least some of light absorbing agents AF have been removed. In the polarizing plate POL-2 according to the embodiment illustrated in FIGS. 4A and 4B, the polarizer layer NPVA from which the at least some of the light absorbing agents AF have been removed may be referred to as a non-polarizing portion NPVA.

The thickness of a polarizer layer PVA-2 in the transmissive area HA-P may be smaller than the thickness of the polarizer layer PVA-2 in a polarizing area AA-P. As a result, a recess CU-PVA may be defined between the polarizer layer PVA-2 in the transmissive area HA-P and the polarizer layer PVA-2 in the polarizing area AA-P. The recess CU-PVA of the polarizer layer PVA-2 may correspond to the recess CU-P (see FIG. 3A) of the polarizing plate POL (see FIG. 3A). The recess CU-PVA is a non-polarizing part and may correspond to the non-polarizing portion NPVA.

The non-polarizing portion NPVA of the polarizer layer PVA-2 may be a portion, of a stretched film PF constituting the polarizer layer PVA-2, from which the light absorbing agents AF have been removed. The number of light absorbing agents AF included per unit area of the polarizer layer PVA-2 may be larger than the number of light absorbing agents AF included per unit area of the polarizer layer PVA-2 in the transmissive area HA-P, which is the non-polarizing portion NPVA. The light transmittance in the non-polarizing portion NPVA may be greater than the light transmittance in the polarizing area AA-P.

Figure 5:
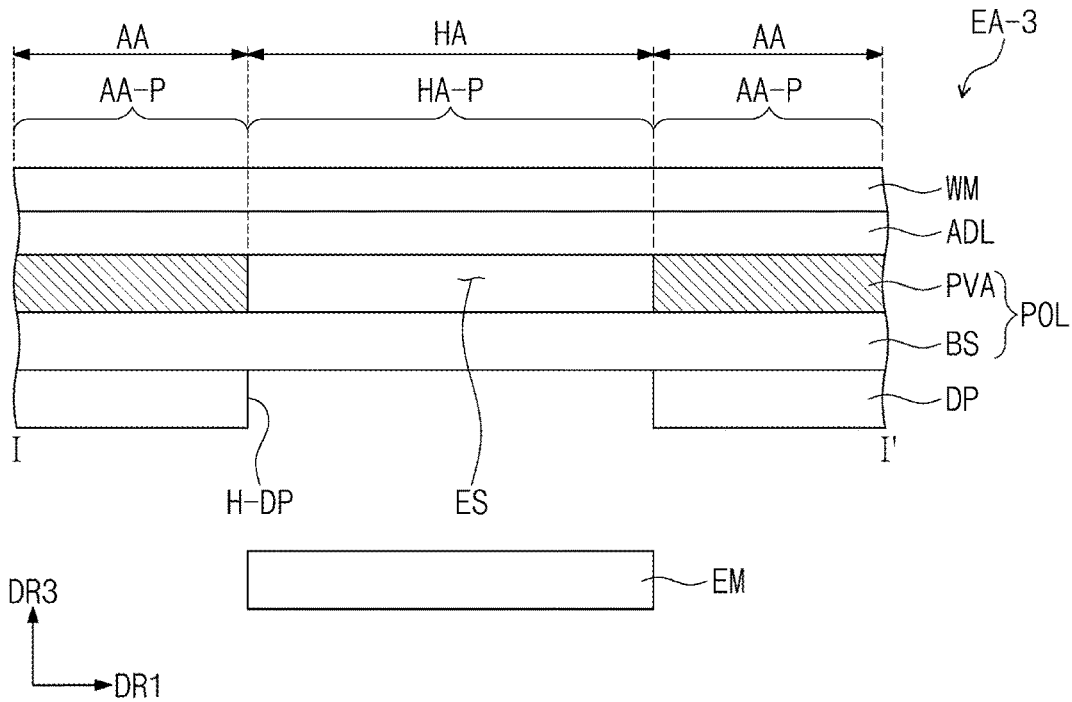
FIG. 5 is a cross-sectional view of a portion of an electronic device according to an embodiment of the inventive concepts.
Figure 6:
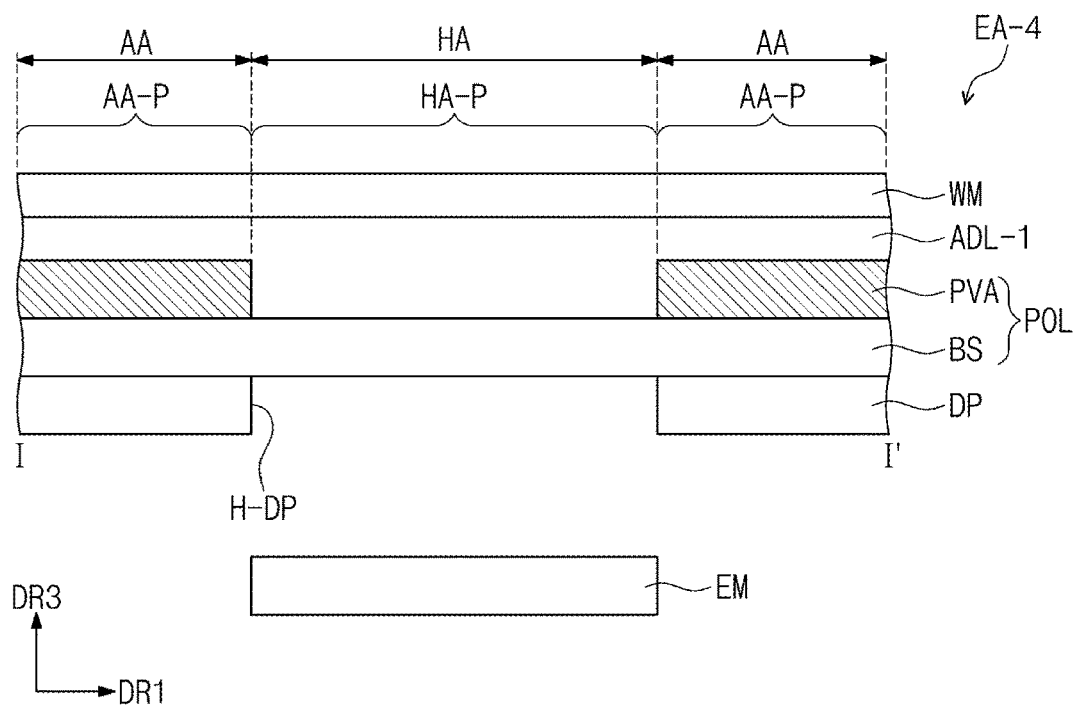
FIG. 6 is a cross-sectional view of a portion of an electronic device according to an embodiment of the inventive concepts.

FIGS. 5 and 6 are each a cross-sectional view, taken along line I-I' illustrated in FIG. 2, illustrating a portion of an electronic device according to an embodiment. Hereinafter, electronic devices EA-3 and EA-4 of embodiments will be described with reference to FIGS. 5 and 6, and a description overlapping with the description given above with reference to FIGS. 1 to 3F will not be given again, and the difference will be mainly described.

In the embodiments, referring to FIGS. 5 and 6, the electronic device EA-3 may further include a window WM disposed on a polarizing plate POL and an adhesive layer ADL disposed between the polarizing plate POL and the window WM, and the electronic device EA-4 may further include a window WM disposed on a polarizing plate POL and an adhesive layer ADL-1 disposed between the polarizing plate POL and the window WM.

In the electronic device EA-3 of an embodiment, the polarizing plate POL and the adhesive layer ADL may be spaced apart in a thickness direction in a first area HA. A space ES formed by the polarizing plate POL and the adhesive layer ADL spaced apart in the thickness direction may correspond to the recess CU-P (see FIG. 3A) of the polarizing plate POL. However, this is only exemplary, and an embodiment of the inventive concepts is not limited thereto. For example, in the electronic device EA-4 of the embodiment illustrated in FIG. 6, the adhesive layer ADL-1 may fill a recess of the polarizing plate POL corresponding to the recess CU-P (see FIG. 3A) of the polarizing plate POL. Accordingly, a base member BS may contact the adhesive layer ADL-1 without a space corresponding to the space ES (see FIG. 5), and as a result, the adhesive layer ADL-1 may contact the base member BS, a polarizer layer PVA, and the window WM.

Figure 7:
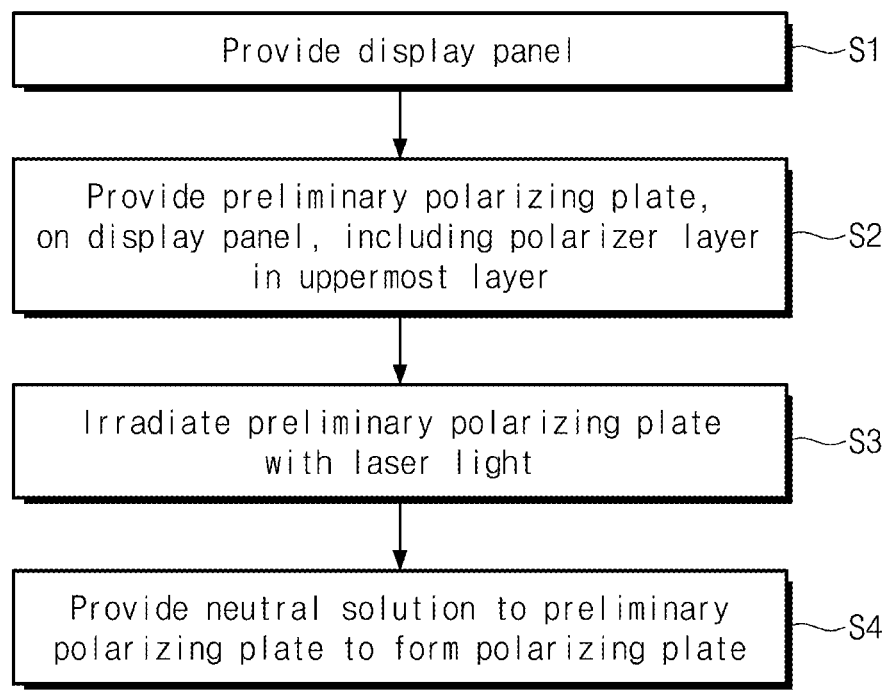
FIG. 7 is a flowchart illustrating a manufacturing method of an electronic device according to an embodiment of the inventive concepts.

FIG. 7 is a flowchart illustrating a manufacturing method of an electronic device according to an embodiment. FIGS. 8 to 12 are each a cross-sectional view illustrating one step of a manufacturing method of an electronic device according to an embodiment. Hereinafter, a manufacturing method of an electronic device according to an embodiment of the inventive concepts will be described with reference to FIGS. 7 and 12, and a description overlapping with the description given above with reference to FIGS. 1 to 6 will not be given again, and the difference will be mainly described.

Referring to FIG. 7, the manufacturing method of an electronic device according to an embodiment includes providing a display panel (S1), providing a preliminary polarizing plate, on the display panel, including a polarizer layer in an uppermost layer (S2), irradiating the preliminary polarizing plate with laser light (S3), and providing a neutral solution to the preliminary polarizing plate to form a polarizing plate (S4).

Figure 8:
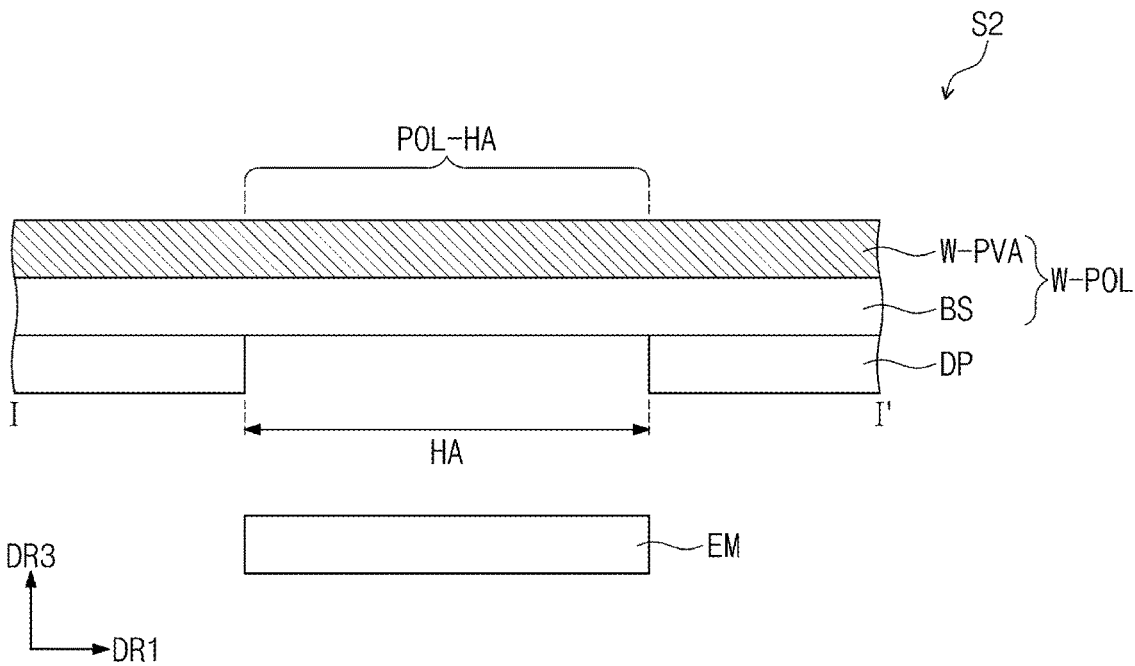
FIG. 8 is a cross-sectional view illustrating one step of a manufacturing method of an electronic device according to an embodiment of the inventive concepts.

FIG. 8 schematically illustrates providing a preliminary polarizing plate W-POL on a display panel DP (S2). Referring to FIG. 8, the preliminary polarizing plate W-POL may be provided on the display panel DP. As described above, the preliminary polarizing plate W-POL provided on the display panel DP may include a polarizer layer W-PVA including a stretched film PF (see FIG. 4B) and light absorbing agents AF (see FIG. 4B). The preliminary polarizing plate W-POL may include a base member BS and the polarizer layer W-PVA disposed on the base member BS. The provided display panel DP may have a hole HA defined in a portion overlapping an electronic module EM.

Figure 9:
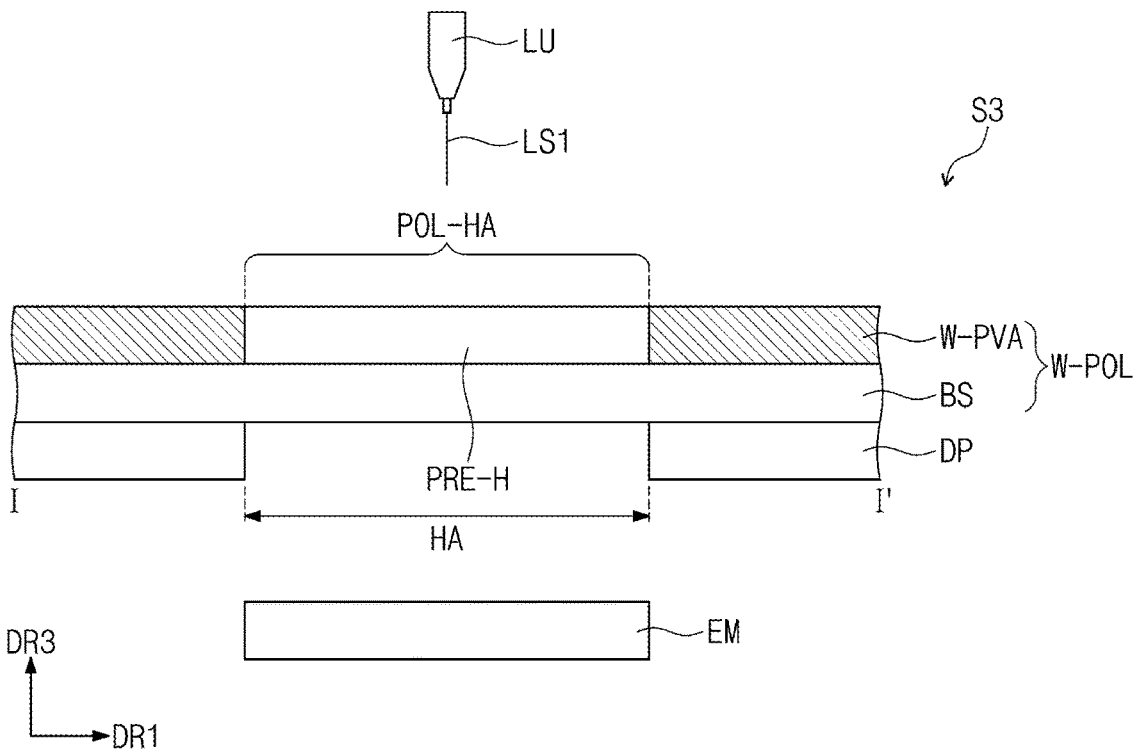
FIG. 9 is a cross-sectional view illustrating one step of a manufacturing method of an electronic device according to an embodiment of the inventive concepts.

FIG. 9 schematically illustrates irradiating the preliminary polarizing plate W-POL with laser light LS1 (S3). Referring to FIG. 9, the manufacturing method of an electronic device of an embodiment includes the irradiating of the preliminary polarizing plate W-POL with the laser light LS1. The preliminary polarizing plate W-POL may be irradiated with the laser light LS1 by using a laser unit LU. A preliminary transmissive area POL-HA to be defined later as a transmissive area HA-P of a polarizing plate POL (see FIG. 3A) may be irradiated with the laser light LS1. In an area irradiated with the laser light LS1, a first polymer having a first molecular weight constituting the film PF (see FIG. 4B) of the polarizer layer W-PVA may be decomposed into a second polymer having a second molecular weight. That is, the stretched polymer film constituting the polarizer layer W-PVA may be decomposed into the form of a low molecular weight polymer, an oligomer, or a monomer by the laser light LS1. Accordingly, the area of the polarizer layer W-PVA irradiated with the laser light LS1 may become a preliminary hole region PRE-H in which the polymer film may be decomposed and removed.

In an embodiment, the laser light LS1 may be pulse laser light, and a pulse width thereof may be about a few picoseconds or less. The laser light LS1 having a pulse width of about a few picoseconds or less may form the preliminary hole region PRE-H in the preliminary polarizing plate W-POL by decomposing the first polymer included in the polarizer layer W-PVA. When the pulse width exceeds about a few picoseconds, sufficient energy for decomposing the first polymer into the second polymer may not be provided.

The laser light LS1 may be selected from light having wavelengths in a range of about 340 nm to about 810 nm. The polarizer layer W-PVA included in the preliminary polarizing plate W-POL may include the light absorbing agents AF (see FIG. 4B). Because the light absorbing agents AF (see FIG. 4B) are capable of absorbing light having wavelengths in the range of about 340 nm to about 810 nm, the first polymer included in the polarizer layer W-PVA may be decomposed into the second polymer only when the polarizer layer W-PVA is irradiated with light selected from light having wavelengths in the range.

The output of the laser light LS1 may range from about 0.5 W to about 10 W. Laser light LS1 having an output value of less than about 0.5 W may not have sufficient energy to remove the polarizer layer W-PVA, and laser light LS1 having an output value exceeding about 10 W may damage the base member BS disposed below the polarizer layer W-PVA or the display panel DP disposed therebelow due to the energy of the laser light LS1.

Figure 10:
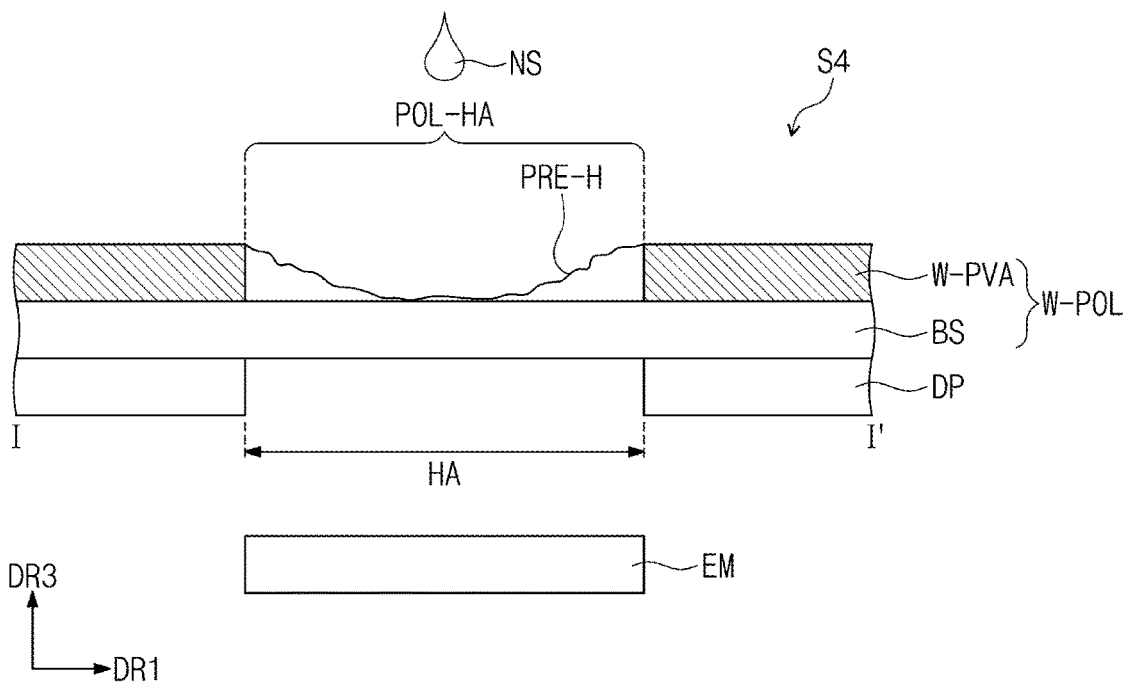
FIG. 10 is a cross-sectional view illustrating one step of a manufacturing method of an electronic device according to an embodiment of the inventive concepts.

FIG. 10 schematically illustrates providing a neutral solution NS to the preliminary polarizing plate W-POL to form the polarizing plate POL (S4). The manufacturing method of an electronic device of an embodiment includes the providing of the neutral solution NS to the preliminary hole region PRE-H (S4) formed in the irradiating with the laser light LS1 (S3). The neutral solution provided may be deionized water.

When the neutral solution NS is provided to the preliminary hole region PRE-H, a portion of the film including the second polymer into which the first polymer has been decomposed may be removed to define a hole H-PVA (see FIG. 3B) in the polarizer layer W-PVA. The hole H-PVA (see FIG. 3B) formed in the polarizer layer W-PVA corresponds to a recess CU-P (see FIG. 3A) of the polarizing plate POL (see FIG. 3A).

The temperature of the provided neutral solution NS may be from about 5° C. to about 90° C. A neutral solution NS having a temperature lower than about 5° C. may not have sufficient dissolving power to dissolve the second polymer. For example, there occurs a problem that process time increases in sufficiently dissolving the residue of the second polymer in the neutral solution NS having a temperature lower than about 5° C. A neutral solution NS having a temperature exceeding about 90° C. causes a problem of lowering the degree of polarization of a portion, which will be a polarizing area AA-P (see FIG. 3A), of the preliminary polarizing plate W-POL.

Figure 11:
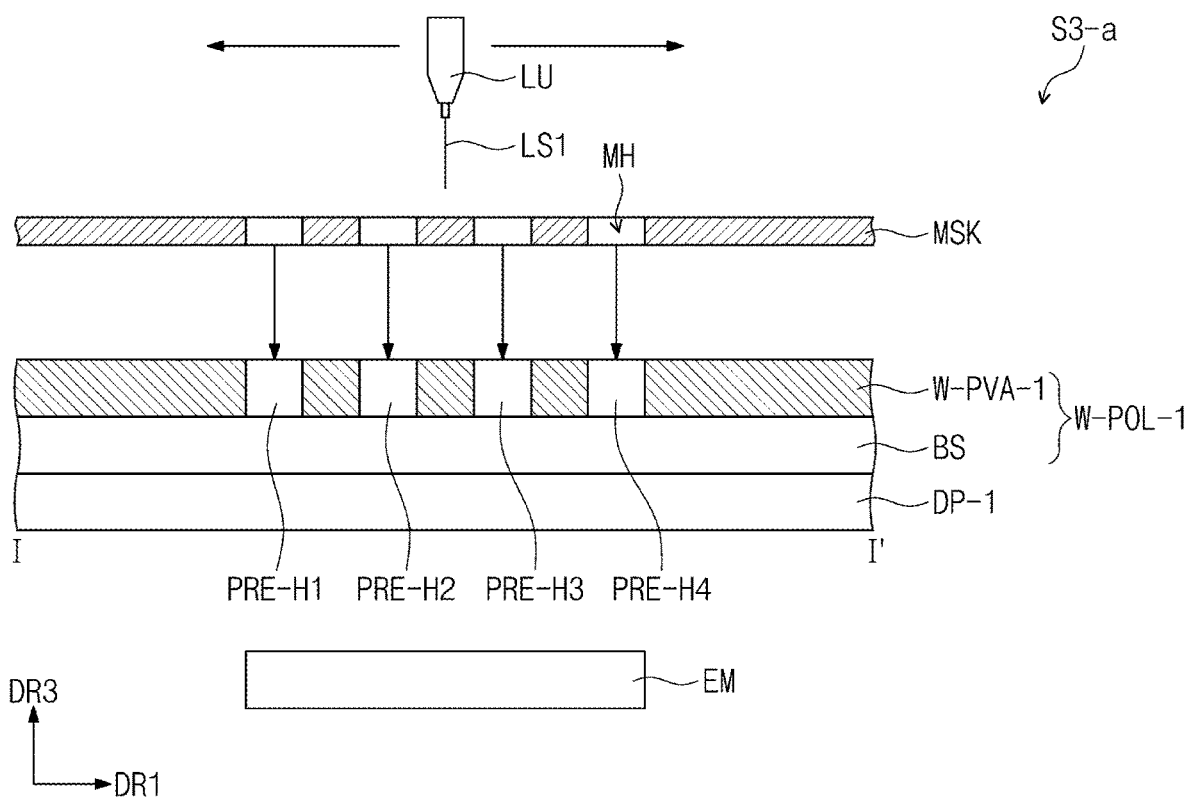
FIG. 11 is a cross-sectional view illustrating one step of a manufacturing method of an electronic device according to an embodiment of the inventive concepts.

FIG. 11 exemplarily illustrates a method of forming a polarizing plate including a plurality of recesses. FIG. 11 illustrates irradiating a preliminary polarizing plate W-POL-1 provided on a display panel DP-1 with laser light LS1 (S3-a). Referring to FIG. 11, a manufacturing method of an electronic device according to an embodiment may include the irradiating with the laser light LS1 (S3-a) by moving a laser unit LU while a mask MSK is provided on the preliminary polarizing plate W-POL-1. A surface of the preliminary polarizing plate W-POL-1 may be irradiated with the laser light LS1 through a transmissive portion MH defined in the mask MSK. Portions irradiated with the laser light LS1 may be a plurality of preliminary hole regions PRE-H1, PRE-H2, PRE-H3, and PRE-H4 to be defined later as a plurality of recesses CU1-P, CU2-P, CU3-P, and CU4-P of a polarizing plate POL-1 (see FIG. 3C).

Figure 12:
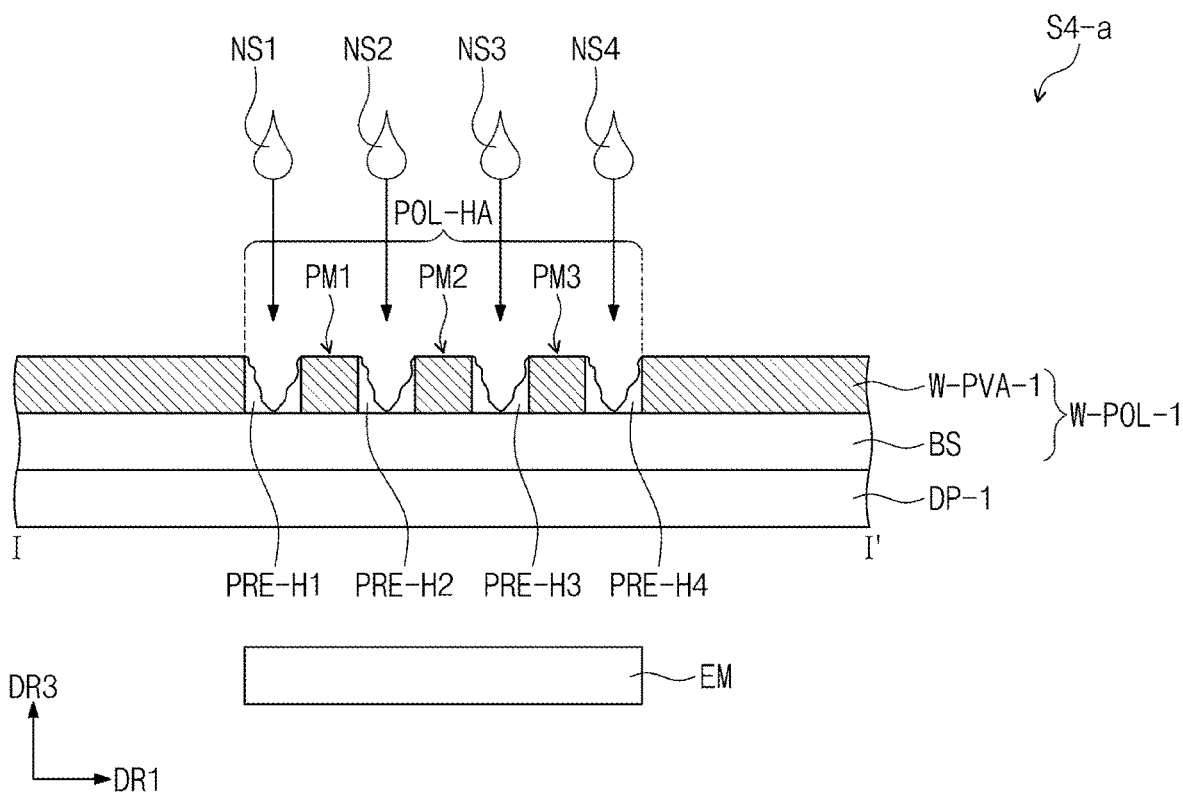
FIG. 12 is a cross-sectional view illustrating one step of a manufacturing method of an electronic device according to an embodiment of the inventive concepts.

FIG. 12 illustrates providing neutral solutions NS1, NS2, NS3, and NS4 on the preliminary polarizing plate W-POL-1 (S4-a). Referring to FIG. 12, the neutral solutions NS1, NS2, NS3, and NS4 may be provided on the preliminary hole regions PRE-H1, PRE-H2, PRE-H3, and PRE-H4. When the neutral solutions NS1, NS2, NS3, and NS4 are provided, a plurality of holes H-PVA1, H-PVA2, H-PVA3, and H-PVA4 (see FIG. 3D) and a plurality of protrusions PM1, PM2, and PM3 (see FIG. 3D) may be defined in a polarizer layer W-PVA-1. That is, when the neutral solutions NS1, NS2, NS3, and NS4 are provided, the polarizer layer W-PVA-1 may be removed at the portions irradiated with the laser light LS1. The plurality of holes H-PVA1, H-PVA2, H-PVA3, and H-PVA4 (see FIG. 3D) defined by removing the polarizer layer W-PVA-1 may correspond to the plurality of recesses CU1-P, CU2-P, CU3-P, and CU4-P (see FIG. 3C) of the polarizing plate POL-1 (see FIG. 3C).

Figure 13:
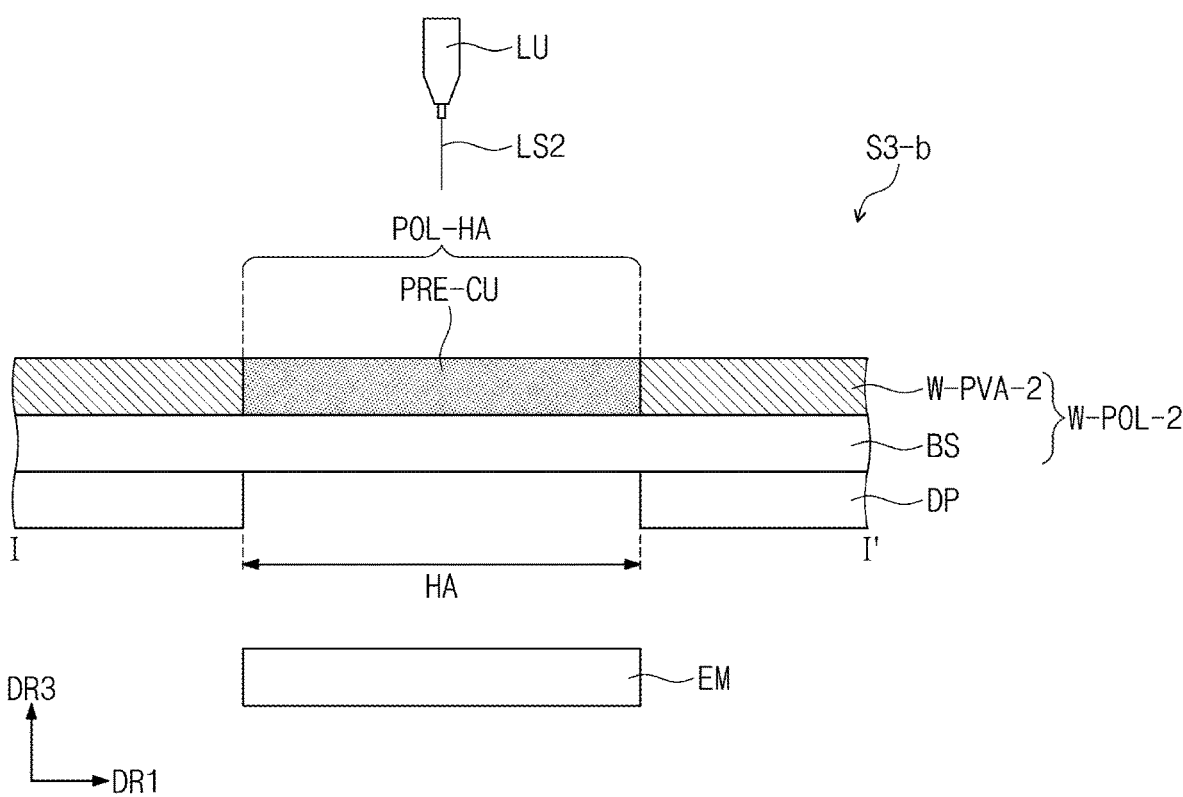
FIG. 13 is a cross-sectional view illustrating one step of a manufacturing method of an electronic device according to an embodiment of the inventive concepts.
Figure 14:
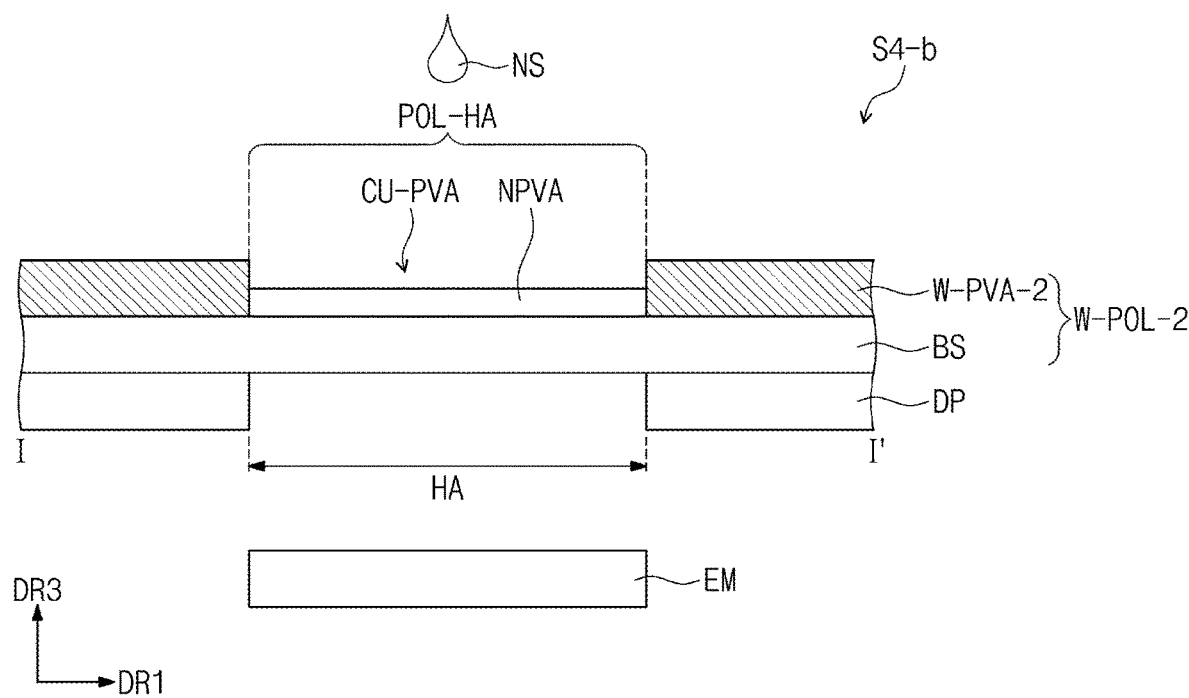
FIG. 14 is a cross-sectional view illustrating one step of a manufacturing method of an electronic device according to an embodiment of the inventive concepts.

FIG. 13 illustrates irradiating with laser light in a manufacturing method of an electronic device of an embodiment, and FIG. 14 illustrates providing a neutral solution in a manufacturing method of an electronic device of an embodiment. There is a difference in energy of provided laser light between the manufacturing method of an electronic device of the embodiment described with reference to FIGS. 13 and 14 and the manufacturing method of an electronic device of the embodiment described with reference to FIGS. 8 to 12.

FIG. 13 schematically illustrates irradiating with laser light LS2 (S3-b). The irradiating with the laser light LS2 in the manufacturing method of an electronic device of an embodiment may include dissociating bond of a film PF (see FIG. 4B) and light absorbing agents AF (see FIG. 4B) included in a polarizer layer W-PVA-2. By the dissociating of the bond of the film PF (see FIG. 4B) and the light absorbing agents AF (see FIG. 4B) included in the polarizer layer W-PVA-2, a preliminary recess region PRE-CU to be defined later as a recess CU-PVA of a polarizer layer PVA-2 (see FIG. 4A) may be formed in the polarizer layer W-PVA-2.

In the irradiating with the laser light LS2 (S3-b), the laser light LS2 may be continuous laser light or pulse laser light. When the laser light LS2 is the pulse laser light, the pulse width may be greater than about a few picoseconds and equal to or less than about a few nanoseconds.

The laser light LS2 may be selected from light having wavelengths in a range of about 340 nm to about 810 nm. Because the light absorbing agents AF (see FIG. 4B) are capable of absorbing light having wavelengths in the range of about 340 nm to about 810 nm, the bond of the light absorbing agents AF (see FIG. 4B) and the film PF (see FIG. 4B) included in the polarizer layer W-PVA-2 may be dissociated only when the polarizer layer W-PVA-2 is irradiated with light selected from light having wavelengths in the range.

The output of the laser light LS2 may range from about 0.5 W to about 10 W. Laser light LS2 having an output value of less than about 0.5 W may not have sufficient energy to dissociate the bond of the light absorbing agents AF (see FIG. 4B) an the film PF (see FIG. 4B), and laser light LS2 having an output value exceeding about 10 W may damage a portion of the polarizer layer W-PVA-2 due to the energy of the laser light LS2.

FIG. 14 illustrates providing a neutral solution NS (S4-b) in a manufacturing method of an electronic device of an embodiment. A non-polarizing portion NPVA may be formed by providing the neutral solution NS to the preliminary recess region PRE-CU defined in the polarizer layer W-PVA-2 and by dissolving and removing the dissociated light absorbing agents. The thickness of the polarizer layer PVA-2 (see FIG. 4A) becomes smaller in the non-polarizing portion NPVA (FIG. 4A) than in a polarizing area AA-P (see FIG. 4A), and consequently the recess CU-PVA (see FIG. 4A) may be formed in the polarizer layer PVA-2 (see FIG. 4A). The thickness of the polarizer layer PVA-2 (see FIG. 4A) corresponding to the recess CU-PVA (see FIG. 4A) may be smaller than the thickness of the polarizer layer PVA-2 (see FIG. 4A) in the polarizing area AA-P.

The provided neutral solution NS may have a temperature of about 5° C. to about 90° C. A neutral solution NS having a temperature lower than about 5° C. may not have sufficient dissolving power to dissolve the light absorbing agents AF (see 4B). For example, there is a problem that process time increases in sufficiently dissolving the residue of the light absorbing agents AF (see FIG. 4B) in the neutral solution NS having a temperature lower than about 5° C. A neutral solution NS having a temperature exceeding about 90° C. causes a problem of lowering the degree of polarization of a portion, which will be the polarizing area AA-P (see FIG. 3A), of a preliminary polarizing plate W-POL-2.

In an embodiment, by removing a portion of the polarizer layer or by depolarizing the polarizer layer and having a smaller thickness in the transmissive area HA-P than in a surrounding portion of the polarizer layer for the transmissive area HA-P of the polarizing plate POL overlapping the electronic module, an electronic device may be provided which has improved light transmittance even in an area where the electronic module is disposed.

In an embodiment, a manufacturing method of an electronic device with improved light efficiency may be provided by including the irradiating with the laser light on a surface of the polarizing plate including the polarizer layer and the providing of the neutral solution to the polarizer layer irradiated with the laser light, and thus by physically removing a portion of the polarizer layer or depolarizing a portion of the polarizer layer.

The electronic device according to an embodiment may exhibit improved light transmittance in an area overlapping the electronic module by including the polarizing plate having the non-polarizing portion in the area overlapping the electronic module.

The manufacturing method of an electronic device according to an embodiment may include the irradiating of a portion of the polarizing plate overlapping the electronic module with the laser light and the providing of the neutral solution, thereby providing an electronic device with improved light transmittance in an area overlapping the electronic module.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
an electronic module;
a display panel including a first area overlapping the electronic module and a second area surrounding at least a portion of the first area; and
a polarizing plate which is disposed on the display panel and includes a base member disposed directly on the display panel and a polarizer layer directly disposed on the base member;
a window disposed on the polarizing plate; and
an adhesive layer disposed between the polarizing plate and the window,
wherein the polarizing plate comprises:

a transmissive area which overlaps the first area and in which at least one recess is defined;

a polarizing area overlapping the second area;

wherein the adhesive layer is directly adhered to an entirety of a bottom surface of the window and at least a portion of the adhesive layer is directly adhered to a top surface of the base member, and wherein the base member is disposed on an entirety of a bottom surface of the polarizer layer and includes a phase delay layer.

2. The electronic device of claim 1, wherein the at least one recess completely penetrates the polarizer layer.

3. The electronic device of claim 1, wherein the polarizer layer comprises a stretched film and a plurality of light absorbing agents adsorbed on the film, and the at least one recess comprises a portion of the film from which at least some of the light absorbing agents have been removed.

4. The electronic device of claim 1, wherein the display panel comprises a pixel layer including a plurality of light emitting areas and a plurality of non-light emitting areas, and the at least one recess overlaps at least some of the plurality of non-light emitting areas.

5. The electronic device of claim 1, wherein the at least one recess comprises a plurality of recesses in the transmissive area, the transmissive area comprises a protrusion disposed between each of the plurality of recesses, and a thickness of the polarizing plate is smaller at each of the plurality of recesses than at the protrusion.

6. The electronic device of claim 5, wherein a light transmittance at the plurality of recesses is greater than a light transmittance at the protrusion.

7. The electronic device of claim 1, wherein the polarizing plate and the adhesive layer are spaced apart from each other in a thickness direction in the transmissive area.

8. The electronic device of claim 1, wherein the adhesive layer completely fills the at least one recess.

* * * * *